(12) United States Patent
Sakai (10) Patent No.: US 9,975,284 B2
(45) Date of Patent: May 22, 2018

(54) ELECTRON BEAM CURABLE RESIN COMPOSITION, RESIN FRAME FOR REFLECTORS, REFLECTOR, SEMICONDUCTOR LIGHT EMITTING DEVICE, AND METHOD FOR PRODUCING MOLDED BODY

(71) Applicant: Toshiyuki Sakai, Tokyo (JP)

(72) Inventor: Toshiyuki Sakai, Tokyo (JP)

(73) Assignee: DAI NIPON PRINTING CO., LTD., Tokyo (JP)

( * ) Notice: Subject to any disclaimer, the term of this patent is extended or adjusted under 35 U.S.C. 154(b) by 0 days. days.

(21) Appl. No.: 14/372,280

(22) PCT Filed: Jan. 17, 2013

(86) PCT No.: PCT/JP2013/050753
§ 371 (c)(1),
(2) Date: Oct. 7, 2014

(87) PCT Pub. No.: WO2013/108814
PCT Pub. Date: Jul. 25, 2013

(65) Prior Publication Data
US 2015/0041839 A1    Feb. 12, 2015

(30) Foreign Application Priority Data
Jan. 17, 2012  (JP) ................ 2012-007387

(51) Int. Cl.
*C08F 255/08* (2006.01)
*B29C 45/00* (2006.01)
(Continued)

(52) U.S. Cl.
CPC .......... *B29C 45/0001* (2013.01); *B29B 13/08* (2013.01); *B29C 35/0866* (2013.01);
(Continued)

(58) Field of Classification Search
CPC ....... H01L 33/60; H01L 33/501; H01L 33/48; H01L 33/56; B29B 13/08; B29C 45/0001;
(Continued)

(56) References Cited

U.S. PATENT DOCUMENTS

| 4,097,448 A * | 6/1978 | Heilman ............ C08G 59/4261 523/444 |
| 4,996,137 A * | 2/1991 | Inoue ................. G03C 1/48569 430/378 |

(Continued)

FOREIGN PATENT DOCUMENTS

| JP | 47-14025 A | 4/1972 |
| JP | 55-54332 A | 4/1980 |

(Continued)

*Primary Examiner* — Ermias Woldegeorgis
(74) *Attorney, Agent, or Firm* — Ladas & Parry LLP (57) ABSTRACT

Provided are an electron beam curable resin composition including polymethylpentene, and a crosslinking agent, in which the crosslinking agent has a saturated or unsaturated ring structure, at least one atom among atoms forming at least one ring is bonded to any allylic substituent of an allyl group, a methallyl group, an allyl group through a linking group, and a methallyl group through a linking group, and a molecular weight is 1,000 or less, a resin frame for reflectors using the resin composition, a reflector, and a molding method using the resin composition.

12 Claims, 1 Drawing Sheet

(51) Int. Cl.
| | |
|---|---|
| H01L 33/56 | (2010.01) |
| H01L 33/48 | (2010.01) |
| H01L 33/60 | (2010.01) |
| C08K 5/3492 | (2006.01) |
| B29B 13/08 | (2006.01) |
| B29C 71/04 | (2006.01) |
| C08K 3/22 | (2006.01) |
| C08K 3/36 | (2006.01) |
| C08K 7/14 | (2006.01) |
| C08L 23/20 | (2006.01) |
| B29C 35/08 | (2006.01) |
| H01L 33/50 | (2010.01) |
| H01L 23/29 | (2006.01) |
| B29K 35/00 | (2006.01) |
| B29L 12/00 | (2006.01) |
| B29K 105/00 | (2006.01) |
| B29K 105/16 | (2006.01) |
| B29K 509/02 | (2006.01) |
| B29K 509/08 | (2006.01) |
| H01L 31/0216 | (2014.01) |
| H01L 33/46 | (2010.01) |

(52) U.S. Cl.
CPC ............ *B29C 71/04* (2013.01); *C08F 255/08* (2013.01); *C08K 3/22* (2013.01); *C08K 3/36* (2013.01); *C08K 5/34924* (2013.01); *C08K 7/14* (2013.01); *C08L 23/20* (2013.01); *H01L 33/48* (2013.01); *H01L 33/56* (2013.01); *H01L 33/60* (2013.01); *B29C 2035/0877* (2013.01); *B29K 2035/00* (2013.01); *B29K 2039/00* (2013.01); *B29K 2105/0032* (2013.01); *B29K 2105/16* (2013.01); *B29K 2509/02* (2013.01); *B29K 2509/08* (2013.01); *B29L 2012/00* (2013.01); *C08K 2003/2241* (2013.01); *H01L 23/296* (2013.01); *H01L 31/02167* (2013.01); *H01L 33/46* (2013.01); *H01L 33/501* (2013.01); *H01L 2224/48091* (2013.01); *Y10T 428/24273* (2015.01)

(58) Field of Classification Search
CPC ...... B29C 71/04; C08K 5/34924; C08K 3/22; C08F 255/08; C08F 5/34924; C08L 23/20
See application file for complete search history.

(56) References Cited

U.S. PATENT DOCUMENTS

| | | | | |
|---|---|---|---|---|
| 2002/0134986 | A1* | 9/2002 | Kamemura | H01L 33/46 257/98 |
| 2003/0031850 | A1* | 2/2003 | Scharnke | B29C 47/0004 428/221 |
| 2009/0268279 | A1* | 10/2009 | Higuchi | H01L 33/60 359/360 |
| 2009/0315049 | A1* | 12/2009 | Urasaki | H01L 33/486 257/98 |

FOREIGN PATENT DOCUMENTS

| | | | |
|---|---|---|---|
| JP | 59059712 | A * | 4/1984 |
| JP | 60-135415 | A | 7/1985 |
| JP | 03111843 | A * | 5/1991 |
| JP | 5-24109 | A | 2/1993 |
| JP | 2006-8972 | A | 1/2006 |
| JP | 2006-503160 | A | 1/2006 |
| JP | 2009-149845 | A | 7/2009 |
| JP | 2012-180432 | A | 9/2012 |
| WO | 2004/036661 | A2 | 4/2004 |

* cited by examiner

ELECTRON BEAM CURABLE RESIN COMPOSITION, RESIN FRAME FOR REFLECTORS, REFLECTOR, SEMICONDUCTOR LIGHT EMITTING DEVICE, AND METHOD FOR PRODUCING MOLDED BODY

TECHNICAL FIELD

The present invention relates to an electron beam curable resin composition, a resin frame for reflectors, a reflector, a semiconductor light emitting device, and a method for producing a molded body.

BACKGROUND ART

In the related art, as a method for mounting an electronic component on a substrate, a method (a reflow method) in which an electronic component is temporarily fixed to a predetermined position of a substrate to which solder is attached in advance, the substrate is then heated by means of infrared light, hot air, or the like to melt the solder, and an electronic component is fixed has been adopted. It is possible to increase the mounting density of the electronic component on the surface of the substrate by the method.

However, the electronic component which has been used in the related art has insufficient heat resistance and particularly, in a reflow process using infrared heating, a problem that the surface temperature of the component increases locally, or the like arises. Thus, there has been a demand for a resin composition and an electronic component having further excellent heat resistance.

In addition, since an LED element as a semiconductor light emitting device has a small size, a long life, and excellent power saving performance, LED elements have been widely used as a light source of a display lamp, or the like. In recent years, an LED element having higher brightness has been produced at a relatively low cost, and thus, the use of LED elements as a light source in place of a fluorescent lamp and a light bulb has been considered. When LED elements are used as such a light source, a method has been frequently used in which plural LED elements are arranged on a surface mounting type LED package, that is, a metal substrate (LED mounting substrate) of aluminum or the like, and a reflector (a reflecting body) which reflects light in a predetermined direction is arranged in the vicinity of each LED element to obtain high illuminance.

However, since LED elements give off heat generation during light emitting, in an LED light device adopting such a method, the reflector is deteriorated due to a rising temperature during light emitting of the LED elements, and the reflectivity is degraded and brightness is degraded. Thus, the lifetime of the LED element is shortened. Accordingly, heat resistance is required for the reflector.

In order to respond to the requirement of the heat resistance, in PTL 1, a polymer composition which is used in a reflector of a light emitting diode is proposed and specifically, a polymer composition including polyphthalamide, carbon black, titanium dioxide, glass fibers, and an antioxidant is disclosed. The reflectivity of the composition is measured after the composition undergoes heat aging. The composition has satisfactory reflectivity with less yellowing compared to a polymer composition not including carbon black.

In addition, in PTL 2, a thermosetting light reflecting resin composition using an optical semiconductor device in which an optical semiconductor element and wavelength converting means such as a fluorescent substance are combined is disclosed.

CITATION LIST

Patent Literature

[PTL 1] PCT Japanese Translation Patent Publication No. 2006-503160
[PTL 2] Japanese Unexamined Patent Application Publication No. 2009-149845

SUMMARY OF INVENTION

Technical Problem

However, the heat aging test of the thermosetting light reflecting resin composition disclosed in PTL 2 is performed under a more practical condition of 150° C. for 500 hours for verification. However, the molding time is 90 seconds, which is longer than a molding time of a thermoplastic resin, and post-curing at 150° C. for 2 hours is required. Thus, there is a problem in productivity.

The heat aging test of the polymer composition disclosed in PTL 1 is an evaluation for a short period of time of 3 hours at 170° C., and thus, whether or not satisfactory results in heat resistance and durability can be obtained under the practical condition for a longer period of time is not clear.

From the above, an object of the present invention is to provide an electron beam curable resin composition which can exhibit excellent heat resistance in the reflow process and can exhibit excellent heat resistance even when being formed into a molded body such as a reflector, a resin frame for reflectors using the resin composition, a reflector, a semiconductor light emitting device, and a molding method using the resin composition.

Solution to Problem

As the result of intensive studies to achieve the above object, the present inventor has been found that the object can be achieved by the following inventions. That is, the present invention is as follows.

[1] An electron beam curable resin composition including: polymethylpentene; and a crosslinking agent, wherein the crosslinking agent has a saturated or unsaturated ring structure, at least one atom among atoms forming at least one ring is bonded to any allylic substituent of an allyl group, a methallyl group, an allyl group through a linking group, and a methallyl group through a linking group, and a molecular weight is 1,000 or less.

[2] The electron beam curable resin composition according to [1], wherein at least two atoms among the atoms forming one ring of the crosslinking agent are each independently bonded to the allylic substituent.

[3] The electron beam curable resin composition according to [2], wherein the ring of the crosslinking agent is a six-membered ring, at least two atoms among the atoms forming the ring are each independently bonded to the allylic substituent, and another allylic substituent is bonded to an atom in a meta position with respect to an atom bonded with one allylic substituent.

[4] The electron beam curable resin composition according to any one of [1] to [3], wherein the crosslinking agent is expressed by the following Formula (1).

[Chem. 1]

(1)

(In the Formula (1), $R^1$ to $R^3$ are each independently any allylic substituent of an allyl group, a methallyl group, an allyl group through ester bonding, and a methallyl group through ester bonding.)

[5] The electron beam curable resin composition according to any one of [1] to [3], wherein the crosslinking agent is expressed by the following Formula (2).

[Chem. 2]

(2)

(In the Formula (2), $R^1$ to $R^3$ are each independently any allylic substituent of an allyl group, a methallyl group, an allyl group through ester bonding, and a methallyl group through ester bonding.)

[6] The electron beam curable resin composition according to any one of [1] to [5], wherein 0.1 parts by mass to 15 parts by mass of the crosslinking agent is blended with respect to 100 parts by mass of polymethylpentene.

[7] The electron beam curable resin composition according to any one of [1] to [6], further including a white pigment.

[8] The electron beam curable resin composition according to [7], further including inorganic particles other than the white pigment.

[9] The electron beam curable resin composition according to [8], wherein the inorganic particles other than the white pigment are spherical fused silica particles and/or modified cross-section glass fibers.

[10] A resin frame for reflectors including: a cured product of the electron beam curable resin composition according to any one of [1] to [9].

[11] The resin frame for reflectors according to [10], wherein a thickness is 0.1 mm to 3.0 mm.

[12] A reflector including: a cured product of the electron beam curable resin composition according to any one of [1] to [9].

[13] A semiconductor light emitting device including: an optical semiconductor element; and a reflector which is provided in the vicinity of the optical semiconductor element and reflects light from the optical semiconductor element in a predetermined direction, wherein the optical semiconductor element and the reflector are provided on a substrate, and at least a part of the light reflecting surface of the reflector is composed of a cured product of the electron beam curable resin composition according to any one of [1] to [9].

[14] A method for producing a molded body including: an injection molding process of performing injection molding on the electron beam curable resin composition according to any one of [1] to [9] at an injection temperature of 200° C. to 400° C. and at a mold temperature of 20° C. to 100° C.; and an electron beam irradiation process of performing electron beam irradiation treatment before and after the injection molding process.

Advantageous Effects of Invention

According to the present invention, it is possible to provide an electron beam curable resin composition which can exhibit excellent heat resistance in a reflow process and can exhibit excellent heat resistance even when being formed into a molded body such as a reflector, a resin frame for reflectors using the resin composition, a reflector, a semiconductor light emitting device, and a molding method using the resin composition.

DESCRIPTION OF EMBODIMENTS

[1. Electron Beam Curable Resin Composition]

An electron beam curable resin composition of the present invention includes polymethylpentene and a specific crosslinking agent.

The refractive index of polymethylpentene is 1.46, and this value is very close to the refractive index of a silica particle. Thus, it is possible to suppress inhibition of optical properties such as transmittance and reflectivity even when polymethylpentene is mixed. Considering this point, for example, the curable resin composition is suitably used as a reflector of a semiconductor light emitting device.

However, heat resistance was not sufficient in a reflow process in some cases. To solve this problem, in the present invention, a resin composition exhibiting a sufficient heat resistance even in a reflow process can be obtained by containing a specific crosslinking agent in polymethylpentene and irradiating the resin with an electron beam. Accordingly, even when the resin composition is formed into a reflector, it is possible to prevent the reflector from being deformed by melting of the resin.

Polymethylpentene has properties of having a high melting point of 232° C., not being decomposed even at a processing temperature of about 280° C., and having a decomposition temperature close to 300° C. On the other hand, since organic peroxides and photopolymerization initiators having such properties are not generally present, crosslinking by the organic peroxides and crosslinking by ultraviolet light are not possible.

In addition, even when polymethylpentene is irradiated with an electron beam (for example, absorbed radiation dose: 200 kGy), molecular chains are cut simultaneously with the crosslinking, and thus, effective crosslinking does not occur only by the resin. However, since an effective crosslinking reaction occurs through electron beam irradiation by containing the crosslinking agent according to the present invention, it is possible to prevent deformation by melting of the resin even in a reflow process.

Such a crosslinking agent has a saturated or unsaturated ring structure, and at least one atom among atoms forming at least one ring is bonded to any allylic substituent of an allyl group, a methallyl group, an allyl group through a linking group, and a methallyl group through a linking group. By containing the crosslinking agent having such a structure, satisfactory electron beam curability is exhibited and thus, a resin composition having excellent heat resistance can be formed.

Examples of the saturated or unsaturated ring structure include a cyclo ring, a hetero ring, and an aromatic ring. The number of atoms forming the ring structure is preferably 3 to 12, more preferably 5 to 8, and a 6-membered ring is still more preferable.

In addition, the molecular weight of the crosslinking agent according to the present invention is 1,000 or less, preferably 500 or less, and more preferably 300 or less. When the molecular weight is more than 1,000, the dispersibility in the resin composition is deteriorated and thus, an effective crosslinking reaction cannot occur even when the resin is irradiated with the electron beam.

Further, the number of the ring structures is preferably 1 to 3, more preferably 1 or 2, and still more preferably 1.

Here, examples of the linking group of the crosslinking agent according to the present invention include ester bonding, ether bonding, an alkylene group, and a (hetero)allylene group. An atom that is not bonded to the allylic substituent among the atoms forming the ring is bonded with hydrogen, oxygen, nitrogen, and the like, or is bonded with various substituents.

In the crosslinking agent according to the present invention, it is preferable that at least two atoms among the atoms forming one ring of the crosslinking agent are each independently bonded to the allylic substituent. When the ring structure is a 6-membered ring, it is preferable that at least two atoms among the atoms forming the ring are each independently bonded to the allylic substituent, and with respect to an atom to which one the allylic substituent is bonded, another allylic substituent is bonded to an atom in a meta position.

Further, it is preferable that the crosslinking agent according to the present invention be expressed by the following Formula (1) or (2).

[Chem. 3]

(1)

(In the Formula (1), $R^1$ to $R^3$ are each independently any allylic substituent of an allyl group, a methallyl group, an allyl group through ester bonding, and a methallyl group through ester bonding.)

[Chem. 4]

(2)

(In the Formula (2), $R^1$ to $R^3$ are each independently any allylic substituent of an allyl group, a methallyl group, an allyl group through ester bonding, and a methallyl group through ester bonding.)

Examples of the crosslinking agent expressed by the above Formula (1) include triallyl isocyanurate, methyl diallyl isocyanurate, diallyl monoglycidyl isocyanuric acid, monoallyl diglycidyl isocyanurate, and trimethallyl isocyanurate.

Examples of the crosslinking agent expressed by the above Formula (2) include orthophthalic acid diallyl ester, and isophthalic acid diallyl ester.

The amount of the crosslinking agent blended according to the present invention is preferably 0.1 parts by mass to 15 parts by mass, more preferably 0.5 parts by mass to 5 parts by mass, and still more preferably 0.1 parts by mass to 2.5 parts by mass with respect to 100 parts by mass of polymethylpentene. By blending 0.1 parts by mass to 15 parts by mass of the crosslinking agent, crosslinking can proceed effectively without bleed-out.

As the polymethylpentene resin, a homopolymer of 4-methylpentene-1 is preferable. However, the polymethylpentene resin may be a copolymer of 4-methylpentene-1 and other α-olefin, for example, α-olefin having 2 to 20 carbon atoms such as ethylene, propylene, 1-butene, 1-pentene, 1-hexene, 1-octene, 1-decene, 1-dodecene, 1-tetradecene, 1-octadecene, 1-eicocene, 3-methyl-1-butene, or 3-methyl-1-pentene, or may be a copolymer mainly including 4-methylpentene-1 containing 90 mol % or more of 4-methyl-1-pentene.

Regarding the molecular weight of the homopolymer of 4-methylpentene-1, the weight average molecular weight Mw in terms of polystyrene, measured by gel permeation chromatography, is 1,000 or more, and particularly preferably 5,000 or more.

It is preferable that the electron beam curable resin composition of the present invention include a white pigment. By including the white pigment, the resin composition can be used for a reflector or the like. In addition, it is preferable that the resin composition include inorganic particles other than the white pigment. Examples of the inorganic particles other than the white pigment include spherical fused silica particles, modified cross-section glass fibers "Flat Fiber™", and other glass fibers, and spherical fused silica particles and/or modified cross-section glass fibers are preferable. Such an electron beam curable resin composition is particularly suitable for a reflector.

As the white pigment according to the present invention, titanium oxide, zinc sulfide, zinc oxide, barium sulfide, potassium titanate, and the like can be used singly or in a mixture. Among them, titanium oxide is preferable. The content of the white pigment is preferably 5 parts by mass to 200 parts by mass, more preferably 10 parts by mass to 150 parts by mass, and still more preferably 20 parts by mass to 80 parts by mass, with respect to 100 parts by mass of polymethylpentene resin.

In consideration of formability, and from the viewpoint of obtaining high reflectivity, the average particle size of the white pigment is preferably 0.10 µm to 0.50 µm, more preferably 0.10 µm to 0.40 µm, and still more preferably 0.21 µm to 0.25 µm in a primary particle size distribution. The average particle size can be obtained as an average mass value D50 in particle size distribution measurement by a laser beam diffraction method.

The spherical fused silica particles and the modified cross-section glass fibers according to the present invention can be blended with typical thermoplastic resin compositions and thermosetting resin compositions such as epoxy resin, acryl resin, and silicone resin, and the resultants can be used singly or in a mixture.

Here, the term of "spherical" of the "spherical fused silica particles" does not refer to a fibrous shape such as glass fibers, a shape having a large unevenness difference, and a flaky shape having a thin thickness, but refers to a shape in which the longest distance and the shortest distance between the center and the surface are almost the same. Specifically, the term of "spherical" refers to a substantially spherical shape or a spherical shape in which the following average sphericity is 0.8 or more. Since the spherical fused silica particles have a substantially spherical shape or a spherical shape, the particles are not anisotropic and are highly fillable. In addition, fluidity to a mold, mold wear resistance, and the like are excellent.

The average sphericity can be measured by performing image analysis of a particle image imaged by using, for example, a scanning electron microscope "FE-SEM, Model JSM-6301F" manufactured by Nippon Electronics Co., Ltd. That is, a projected area (A) and peripheral length (PM) of a particle are measured from the resulting image. When an area of a complete circle corresponding to the peripheral length (PM) is (B), the circularity of the particle can be indicated as A/B. Assuming a complete circle having the same peripheral length as the peripheral length (PM) of the sample particle, since $PM=2\pi r$ and $B=\pi r^2$, the expression of $B=\pi \times (PM/2\pi)^2$ is established. Thus, the sphericity of each particle can be calculated as sphericity=$A/B=A\times 4\pi/(PM)^2$. The thus obtained sphericity of 200 arbitrary particles is calculated and an average value thereof is used as an average sphericity of powder. Among commercially available products, products having "a spherical shape" have an average sphericity of 0.8 or more.

For example, the spherical fused silica particles are produced through a process of injecting a silicon dioxide powder raw material (for example, silica stone powder) from a burner into a flame formed in a melting zone inside a furnace in a powder state to accompany a carrier gas such as air. Generally, commercially available products can be used.

The volume average particle size of the spherical fused silica particles is preferably 0.1 µm to 500 µm, more preferably 1 µm to 200 µm, and still more preferably 5 µm to 150 µm from the viewpoint of the balance between heat resistance and formability. The volume average particle size can be obtained as an average mass value D50 in particle size distribution measurement by a laser beam diffraction method.

In addition, the "modified cross-section glass fibers" refer to fibers having a cross-sectional shape in which a minor axis and a major axis of the cross section are different. Since an almost equal degree of reinforcement can be made in a resin flow direction (MD) and a vertical direction (TD) thereof, the fiber is excellent in warpage prevention of a molded product.

In the present invention, the glass fibers are preferably glass fibers having a cross sectional shape in which the minor axis D1 of the cross section is 0.5 µm to 25 µm, the major axis D2 is 0.6 µm to 300 µm, and a ratio D2/D1 of D2 relative to D1 is 1.2 to 30, and an average fiber length of 0.75 µm to 300 µm. The fiber size and the fiber length can be obtained in such a manner that a predetermined amount of glass fibers are randomly extracted from an arbitrary point of a glass fiber laminated body, the extracted fibers are pulverized with a mortar, or the like, and the resultant is measured by an image processing apparatus.

The content of the spherical fused silica particles and/or the modified cross-section glass fibers is preferably 10 parts by mass to 300 parts by mass, more preferably 30 parts by mass to 200 parts by mass, and still more preferably 50 parts by mass to 120 parts by mass with respect to 100 parts by mass of the polymethylpentene resin.

The electron beam curable resin composition of the present invention can be prepared by mixing the aforementioned polymethylpentene resin and the crosslinking agent with at least any inorganic particles selected from the spherical fused silica particles, the modified cross-section glass fibers, and other glass fibers, and the white pigment, as required, at the aforementioned predetermined ratio. As for the mixing method, known means such as stirrers such as a two-roll mill, a three-roll mill, a homogenizer, and a planetary mixer, and melt kneading machines such as a Polylab system, and a Labo Plastomill can be applied. The aforementioned means may be used under any condition of room temperature, a cooled state, a heated state, normal pressure, a decompressed state, and a pressurized state.

As long as the effect of the present invention is not impaired, various additives can be added. For example, for the purpose of improving the properties of the resin composition, various additives such as whiskers, silicone powders, thermoplastic elastomers, organic synthetic rubbers, internal releasing agents such as fatty acid ester, glyceric acid esters, zinc stearate, and calcium stearate, antioxidants such as benzophenone-based antioxidants, salicylic acid-based antioxidants, cyanoacrylate-based antioxidants, isocyanurate-based antioxidants, anilide oxalate-based antioxidants, benzoate-based antioxidants, hindered amine-based antioxidants, benzotriazole-based antioxidants, and phenol-based antioxidants, and light stabilizers such as hindered amine-based light stabilizers and benzoate-based light stabilizers can be blended.

By using the electron beam curable resin composition of the present invention, various molded bodies can be molded and a thin molded body (for example, a reflector) having a thinner thickness can be prepared.

Such a molded body is preferably produced by a molding method of the present invention. That is, the molded body is preferably prepared by a molding method including an injection molding process of performing injection molding on the electron beam curable resin composition of the present invention at a cylinder temperature of 200° C. to 400° C. and a mold temperature of 20° C. to 100° C., and an electron beam irradiation process of performing electron beam irradiation treatment before and after the injection molding process.

As long as formability is not impaired, a crosslinking reaction by electron beam irradiation can be performed before the molding.

The acceleration voltage of the electron beam can be appropriately selected depending on a resin and a thickness of the layer to be used. For example, when a molded product has a thickness of about 1 mm, typically, an uncured resin layer is preferably cured at an acceleration voltage of about 250 kV to 2,000 kV. In the electron beam irradiation, the higher the acceleration voltage is, the higher the transmission capacity is. Thus, when a base material which is deteriorated by the electron beam is used as a base material, the acceleration voltage is selected so that the transmission depth of the electron beam becomes substantially equal to the thickness of the resin layer, and thus, excessive electron beam irradiation to the base material can be suppressed and deterioration of the base material by the excessive electron beam can be minimized. In addition, the absorbed radiation dose when the resin is irradiated with the electron beam is appropriately selected depending on the constitution of the resin composition. However, a dose in which the crosslinking density of the resin layer is saturated is preferable, and the dose is preferably 10 kGy to 400 kGy, and more preferably 50 kGy to 200 kGy. Further, the electron beam source is not particularly limited. For example, various electron beam accelerators such as a Cockcroft-Walton accelerator, a van de Graaff accelerator, a resonance transformer accelerator, an insulated core transformer accelerator, a linear accelerator, a dynamitron accelerator, and a high frequency accelerator can be used.

Such an electron beam curable resin composition of the present invention can be applied to various uses as a composite material obtained by applying and curing the resin composition on a base material or a cured product of the electron beam curable resin composition. For example, the resin composition can be applied to a heat resistant insulating film, a heat resistant release sheet, a heat resistant transparent base material, a light reflecting sheet of a solar cell, lighting such as LED, and a light source reflector for a television.

[2. Resin Frame for Reflectors]

A resin frame for reflectors of the present invention is made of a cured product obtained by molding the aforementioned electron beam curable resin composition of the present invention. Specifically, the resin for reflectors of the present invention is used as a pellet, and is formed into a resin frame having a desired shape by injection molding to produce a resin frame for reflectors of the present invention. The thickness of the resin frame for reflectors is preferably 0.1 mm to 3.0 mm, more preferably 0.1 mm to 1.0 mm, and still more preferably 0.1 mm to 0.5 mm.

Using the electron beam curable resin composition of the present invention, a thinner resin frame can be prepared compared to a resin frame, for example, using glass fiber whose shape is anisotropic. Specifically, a resin frame having a thickness of 0.1 mm to 3.0 mm can be produced. In addition, even when the thickness of the thus molded resin frame for reflectors of the present invention is reduced, warpage caused by including an anisotropic filler such as a glass fiber does not occur, and thus, shape stability and handleability are excellent.

When an LED chip is mounted on the resin frame for reflectors of the present invention, and further the resin frame is sealed with a known sealing agent, and subjected to die bonding so as to have a desired shape, the resin frame can be used as a semiconductor light emitting device. The resin frame for reflectors of the present invention acts as a reflector, and also functions as a frame for supporting the semiconductor light emitting device.

Foaming caused by water is suppressed in the process of producing the frame by containing the spherical fused silica particles in the resin frame for reflectors of the present invention compared to a case in which porous silica particles are blended, and thus, micropores small enough to cause a defect are not formed. Accordingly, in a product using the frame (for example, a semiconductor light emitting element), a defect caused by the micropores does not easily occur and thus, the durability of the product can be improved.

[3. Reflector]

A reflector of the present invention is made of a cured product obtained by curing the aforementioned electron beam curable resin composition of the present invention.

The reflector may be used in combination with a semiconductor light emitting device, which will be described later, or may be used in combination with a semiconductor light emitting device (a substrate for mounting LED) made of another material.

The reflector of the present invention has an action of mainly reflecting light from an LED element of a semiconductor light emitting device to a lens (a light emitting portion). Details of the reflector are the same as the details of a reflector (a reflector 12 which will be described later) applied to the semiconductor light emitting device of the present invention, and thus, the description thereof will be omitted.

Foaming caused by water is suppressed in the process of producing the reflector by containing the spherical fused silica particles in the reflector of the present invention, and thus, micropores small enough to cause a defect are not formed. Accordingly, in a product using the reflector (for example, a semiconductor light emitting element), a defect caused by the micropores does not easily occur and thus, the durability of the product can be improved.

As described above, in a semiconductor light emitting element in which a reflector is formed using the electron beam curable resin composition containing the spherical fused silica particles, micropores small enough to cause a defect in the reflector are not formed, and thus, a defect caused by the micropores does not easily occur. Therefore, the durability of the product can be improved.

[4. Semiconductor Light Emitting Device]

Figure 1:
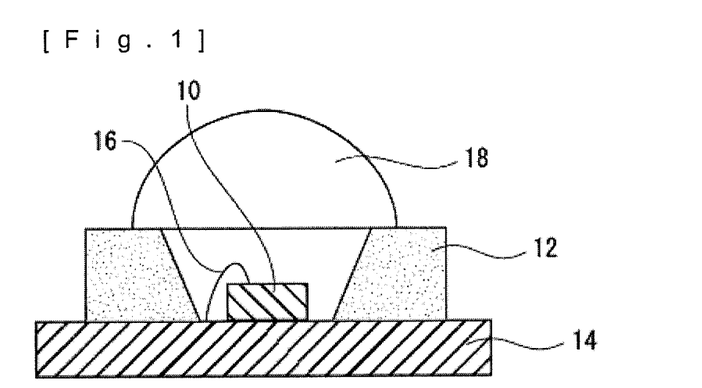
FIG. 1 is a schematic cross-sectional view showing an example of a semiconductor light emitting device of the present invention.

As shown in FIG. 1, a semiconductor light emitting device of the present invention includes an optical semiconductor element (for example, an LED element) 10, and a reflector 12 which is provided in the vicinity of the optical semiconductor element 10 and reflects light from the optical semiconductor element 10 to a predetermined direction, and the optical semiconductor element and the reflector are provided on a substrate 14. Then, at least a part of the light reflecting surface of the reflector 12 (the entire surface in FIG. 1) is made of a cured product of the aforementioned reflector composition of the present invention.

The optical semiconductor element 10 is a semiconductor chip (a light emitting body) which emits radiated light (UV or blue light in the case of a white light LED, in general) and has a double-hetero structure in which an active layer formed of, for example, AlGaAs, AlGaInP, GaP or GaN, is interposed between n-type and p-type clad layers, and is shaped in the form of, for example, a hexahedron, each side having a length of about 0.5 mm. In the case in which the LED element is mounted by wire bonding, the LED element is connected to an electrode (not shown) (a connecting terminal) through a lead wire 16.

The shape of the reflector 12 depends on the shape of the end portion (junction portion) of a lens 18 and is typically cylindrical or annular such as square-shaped, circular-shaped, and ellipse-shaped. In the schematic cross-sectional view of FIG. 1, the reflector 12 is cylindrical (annular). The entire end surface of the reflector 12 is in contact with and fixed to the surface of the substrate 14.

The inner surface of the reflector 12 may be tapered so as to extend upward in order to increase the degree of directivity of light from the optical semiconductor element 10 (refer to FIG. 1).

Further, when the end portion of the reflector 12 close to the lens 18 is processed into a shape according to a shape of the lens 18, the reflector 12 can function as a lens holder.

Figure 2:
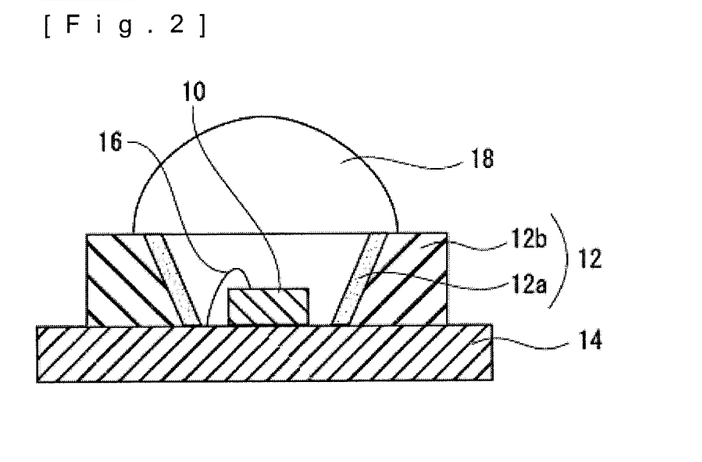
FIG. 2 is a schematic cross-sectional view showing an example of the semiconductor light emitting device of the present invention.

As shown in FIG. 2, only the light reflecting surface of the reflector 12 may be used as a light reflecting layer 12a made of the electron beam curable resin composition of the present invention. In this case, the thickness of the light reflecting layer 12a is preferably 500 μm or less, and more preferably 300 μm or less, from the viewpoint of lowering heat resistance. A member 12b in which the light reflecting layer 12a is formed can be made of known heat resistant resin.

As described above, the lens 18 is provided on the reflector 12. The lens 18 is typically made of a resin and can be formed into a variety of structures according to the purpose, the application and the like and may be colored.

A space portion which is formed by the substrate 14, the reflector 12, and the lens 18 may be a transparent sealing portion or a gap portion as required. The space portion is usually a transparent sealing portion filled with a material that provides translucency and insulation properties or the like. With the space portion, it is possible to prevent electrical failures caused when, in wire-bonding mounting, the lead wire 16 is disconnected, cut or short-circuited from the connection portion with the optical semiconductor element 10 and/or the connection portion with the electrode due to a force applied by direct contact to the lead wire 16 and a vibration, an impact and the like applied indirectly. Additionally, it is possible not only to protect the optical semiconductor element 10 from moisture, dust and the like but also to maintain reliability for a prolonged period.

Examples of the material (a transparent sealant composition) that provides translucency and insulation properties generally include a silicone resin, an epoxy silicone resin, an epoxy-based resin, an acryl-based resin, a polyimide-based resin, a polycarbonate resin and the like. Among them, a silicone resin is preferable in terms of heat resistance, weather resistance, low contraction and resistance to discoloration.

An example of a method for producing the semiconductor light emitting device shown in FIG. 1 will be described below.

First, the reflective resin composition of the present invention is molded into the reflector 12 having a predetermined shape by transfer molding, compression molding, injection molding, or the like using a mold having a cavity space of a predetermined shape. Then, the optical semiconductor element 10, electrode, and lead wire 16 prepared separately are fixed to the substrate 14 by an adhesive or a joining member, and further, the reflector 12 is fixed to the substrate 14. Subsequently, a transparent sealant composition including a silicone resin and the like is injected into a recess portion formed by the substrate 14 and the reflector 12, cured by heating, and drying to form a transparent sealing portion. Then, the lens 18 is arranged on the transparent sealing portion to obtain the semiconductor light emitting device shown in FIG. 1.

After the lens 18 is placed in a state where the transparent sealant composition is not cured, the composition may be cured.

EXAMPLES

Next, the present invention will be described in more detail using examples, but the present invention is not limited to these examples.

Materials used in Examples 1 to 15 and Comparative Examples 1 to 12 are as follows.

(A) Resin

Polymethylpentene resin: TPX RT18 (manufactured by Mitsui Chemicals, Inc., molecular weight: MW 500,000 to 600,000)

Cyclic polyolefin copolymer resin: COC APL6015 (manufactured by Mitsui Chemicals, Inc., glass transition temperature: 145° C.)

Polybutylene terephthlate resin: Novaduran 5008 (manufactured by Mitsubishi Engineering-Plastics Corporation, intrinsic viscosity [η]=0.9 dl/g, melting temperature: 224° C.)

(B) Crosslinking Agent

The crosslinking agents are as follows. In addition, crosslinking agents in which the structure can be specified among the following crosslinking agents are shown in Tables 1-1 and 1-2 and shown by the chemical formulae below.

Crosslinking agent 1: DAP monomer (orthophthalic acid diallyl ester), manufactured by DAISO CO., LTD.

Crosslinking agent 2: DAP 100 monomer (isophthalic acid diallyl ester), manufactured by DAISO CO., LTD.

Crosslinking agent 3: TAIC (trially isocyanurate), manufactured by Nippon Kasei Chemical Co., Ltd.

Crosslinking agent 4: MeDAIC (methyl diallyl isocyanurate), manufactured by SHIKOKU CHEMICALS CORPORATION Crosslinking agent 5: DA-MGIC (diallyl monoglycidyl isocyanuric acid), manufactured by SHIKOKU CHEMICALS CORPORATION Crosslinking agent 6: MA-DGIC (monoallyl diglycidyl isocyanurate), manufactured by SHIKOKU CHEMICALS CORPORATION Crosslinking agent 7: TMAIC (trimethallyl isocyanurate), manufactured by Nippon Kasei Chemical Co., Ltd.

Crosslinking agent 8: RICON 153 (polybutadiene), manufactured by Sartomer Company Inc.

Crosslinking agent 9: RICON 154 (polybutadiene), manufactured by Sartomer Company Inc.

Crosslinking agent 10: RICON 157 (polybutadiene), manufactured by Sartomer Company Inc.

Crosslinking agent 11: TAIL prepolymer (trially isocyanurate prepolymer), manufactured by Nippon Kasei Chemical Co., Ltd.

Crosslinking agent 12: TEPIC (1,3,5-trisglycidyl isocyanuric acid), manufactured by NISSAN CHEMICAL INDUSTRIES, LTD.

Crosslinking agent 13: TEPIC-PAS (mixture of 1,3,5-trisglycidyl isocyanuric acid and phthalic anhydride), manufactured by NISSAN CHEMICAL INDUSTRIES, LTD.

Crosslinking agent 14: 1,3,5-tris(2-carboxyethyl) isocyanurate acrylate

Crosslinking agent 15: M315 (EO-modified isocyanurate triacrylate), manufactured by Toagosei Chemical Industries, Co., Ltd.

Crosslinking agent 16: DPHA (dipentaerythritol hexaacrylate), manufactured by Nippon Kayaku Co., Ltd.

TABLE 1

Table 1-1

| Crosslinking agent and co-crosslinking agent | (molecular weight) | Formula | Structure | | |
|---|---|---|---|---|---|
| | | | R¹ | R² | R³ |
| Crosslinking agent 1 | DAP monomer (246.3) | Formula (2) |  |  | — |
| Crosslinking agent 2 | DAP 100 monomer (246.3) | Formula (2) |  | — |  |
| Crosslinking agent 3 | TAIC (249.3) | Formula (1) |  |  |  |
| Crosslinking agent 4 | MeDAIC (223.2) | Formula (1) | CH₃ |  |  |
| Crosslinking agent 5 | DA-MGIC (265.3) | Formula (1) |  |  |  |
| Crosslinking agent 6 | MA-DGIC (281.3) | Formula (1) |  |  |  |
| Crosslinking agent 7 | TMAIC (291.4) | Formula (1) |  |  |  |

TABLE 2

Table 1-2

| Crosslinking agent and co-crosslinking agent | (molecular weight) | Formula | Structure | | |
|---|---|---|---|---|---|
| | | | R¹ | R² | R³ |
| Crosslinking agent 8 | RICON 153 (4,700) | Formula (3) | | Having polybutadiene skeleton and large number of allyl groups present | |
| Crosslinking agent 9 | RICON 154 (5,200) | Formula (3) | | Having polybutadiene skeleton and large number of allyl groups present | |
| Crosslinking agent 10 | RICON 157 (1,800) | Formula (3) | | Having polybutadiene skeleton and large number of allyl groups present | |
| Crosslinking agent 11 | TAIC Prepolymer (3,000 or more) | | | Large number of ring structure expressed by Formula (1) present | |
| Crosslinking agent 12 | TEPIC (297) | Formula (1) |  |  |  |
| Crosslinking agent 13 | TEPIC-PAS | Formula (1) |  |  |  |

TABLE 2-continued

Table 1-2

| Crosslinking agent and co-crosslinking agent | (molecular weight) | Formula | Structure R¹ | R² | R³ |
|---|---|---|---|---|---|
| Crosslinking agent 14 | CIC acid acrylate (639.6) | Formula (1) | | | |
| Crosslinking agent 15 | M315 (423) | Formula (1) | | | |
| Crosslinking agent 16 | DPHA (578) | Formula (4) | — | | |

Formulae (1) to (4) showing structures in Tables 1-1 and 1-2 are as follows.

[Chem. 5]

(C) Inorganic Particle

Modified cross-section glass fiber "Flat Fiber™": CSG 3PA-820 (manufactured by Nitto Boseki Co., Ltd., fiber length: 3 mm)

(D) White Pigment

Titanium oxide particles: PF-691 (manufactured by Ishihara Sangyo Kaisha, Ltd., rutile-type structure, average particle size: 0.21 μm)

(E) Additive

Silane coupling agent: KBM-303 (manufactured by Shin-Etsu Chemical Co., Ltd.)

Releasing agent: SZ-2000 (manufactured by Sakai Chemical Industry Co., Ltd.)

Antioxidant: IRGANOX 1010 (manufactured by BASF Japan Ltd.)

Processing stabilizer: IRGAFOS 168 (manufactured by BASF Japan Ltd.)

Examples 1 to 15, and Comparative Examples 1 to 12

Various materials were mixed and kneaded to obtain resin compositions as shown in Tables 2, 3, and 4. Here, the kneading was performed using a Polylab system (batch type biaxial kneader).

These compositions were press-molded under the condition of 250° C. for 30 seconds at 20 MPa to have a size of 750 mm×750 mm and a thickness of 0.2 mm, thereby preparing molded bodies.

The molded bodies were irradiated with an electron beam at an acceleration voltage of 250 kV with a predetermined absorbed radiation dose. The following properties of the molded bodies were evaluated. The results are shown in Tables 2, 3, and 4.

(Evaluation 1)

Storage Elastic Modulus

The storage elastic modulus of each molded sample was evaluated using RSA III (manufactured by TA Instruments) under the conditions of a measurement temperature of 25° C. to 300° C., a temperature rising rate of 5° C./min, and a strain of 0.1%. The storage elastic modulus at 260° C. is shown in Tables 2 and 3 below.

(Evaluation 2)
Reflow Heat Resistance

Whether or not each molded sample was deformed was evaluated through a small nitrogen atmosphere reflow apparatus RN-S (manufactured by Panasonic Electric Works Co., Ltd.) which was set such that the maximum temperature of the sample surface was retained at 260° C. for 10 seconds based on a dimensional change rate (a sum of a change rate in a vertical direction and change rate in a horizontal direction). The results are shown in Table 4 below.

(Evaluation 3)
Long-Term Heat Resistance

The light reflectivity was measured at a wavelength of 230 nm to 780 nm using a spectroscopic photometer UV-2550 (manufactured by Shimadzu Corporation) before and after each molded sample was left at 150° C. for 24 hours and 500 hours. In Table 4, the results at a wavelength of 450 nm are shown.

TABLE 3

| | | | Example | | | | | | | Comparative Example | |
|---|---|---|---|---|---|---|---|---|---|---|---|
| | | | 1 | 2 | 3 | 4 | 5 | 6 | 7 | 1 | 2 |
| Material blending | Resin | Parts by mass | 100 | 100 | 100 | 100 | 100 | 100 | 100 | 100 | 100 |
| | Crosslinking agent | Type | Cross-linking agent 1 | Cross-linking agent 2 | Cross-linking agent 3 | Cross-linking agent 4 | Cross-linking agent 5 | Cross-linking agent 6 | Cross-linking agent 7 | Cross-linking agent 8 | Cross-linking agent 9 |
| | | Parts by mass | 2 | 2 | 2 | 2 | 2 | 2 | 2 | 2 | 2 |
| Storage elastic modulus/kPa | Electron beam absorbed radiation dose | 100 kGy | Unmeasurable | 128 | 143 | 158 | 104 | Unmeasurable | Unmeasurable | Unmeasurable | |
| | | 200 kGy | Unmeasurable | 9 | 169 | 4 | 29 | Unmeasurable | Unmeasurable | Unmeasurable | |
| | | 400 kGy | 0.11 | 19 | 358 | 18 | 20 | 12 | 67 | Unmeasurable | |

| | | | Comparative Example | | | | | | |
|---|---|---|---|---|---|---|---|---|---|
| | | | 3 | 4 | 5 | 6 | 7 | 8 | 9 |
| Material blending | Resin | Parts by mass | 100 | 100 | 100 | 100 | 100 | 100 | 100 |
| | Crosslinking agent | Type | Cross-linking agent 10 | Cross-linking agent 11 | Cross-linking agent 12 | Cross-linking agent 13 | Cross-linking agent 14 | Cross-linking agent 15 | Cross-linking agent 16 |
| | | Parts by mass | 2 | 2 | 2 | 2 | 2 | 2 | 2 |
| Storage elastic modulus/kPa | Electron beam absorbed radiation dose | 100 kGy | | | | Unmeasurable | | | |
| | | 200 kGy | | | | Unmeasurable | | | |
| | | 400 kGy | | | | Unmeasurable | | | |

TABLE 4

| | | | Example | | | | | | Comparative Example |
|---|---|---|---|---|---|---|---|---|---|
| | | | 8 | 9 | 10 | 11 | 12 | 13 | 10 |
| Material blending | Resin | Parts by mass | 100 | 100 | 100 | 100 | 100 | 100 | 100 |
| | Crosslinking agent | Type | Crosslinking agent 3 | | | | | | |
| | | Parts by mass | 0.5 | 1 | 2 | 3 | 5 | 10 | 0 |
| Storage elastic modulus/kPa | Electron beam absorbed radiation dose | 50 kGy | Unmeasurable | 22 | 60 | 80 | 155 | 213 | Unmeasurable |
| | | 100 kGy | Unmeasurable | 30 | 143 | 150 | 508 | 675 | Unmeasurable |
| | | 200 kGy | 1 | 40 | 169 | 248 | 787 | 2270 | Unmeasurable |

TABLE 5

|  |  |  |  | Example | | Comparative Example | |
|---|---|---|---|---|---|---|---|
| Composition (parts by mass) | | | | 14 | 15 | 11 | 12 |
| Material blending | Resin | | Polymethylpentene TPX RT-18 | 100 | 100 | | |
| | | | Cyclic polyolefin copolymer APL6015 | | | 100 | |
| | | | Polybutylene terephthlate Novaduran 5008 | | | | 100 |
| | Crosslinking agent | | Crosslinking agent 3: TAIC (trially isocyanurate) | 2 | 2 | 2 | 2 |
| | Inorganic particle | | Modified cross-section glass CSG 3PA-820 | | 60 | 60 | 60 |
| | White pigment | | Titanium oxide PF-691 | 45 | 45 | 45 | 45 |
| | Additives | | KBM-303 | 1.5 | 1.5 | 1.5 | 1.5 |
| | | | SZ-2000 | 0.5 | 0.5 | 0.5 | 0.5 |
| | | | IRGANOX 1010 | 1 | 1 | 1 | 1 |
| | | | IRGAFOS 168 | 0.5 | 0.5 | 0.5 | 0.5 |
| Electron beam absorbed radiation dose (kGy) @ acceleration voltage 250 kV | | | | 100 | 100 | 100 | 100 |
| Evaluation result | Reflow heat resistance MAX 260° C. | Dimensional change rate | Vertical + Horizontal | 0.7% | 0.1% | 0.6% | 0.3% |
| | Long-term heat resistance 150° C. | Reflectivity @ 450 nm | Initial* | 96% | 95% | 85% | 94% |
| | | | 24 h later | 94% | 92% | 84% | 92% |
| | | | 500 h later | 86% | 83% | 76% | 82% |

*"initial" means that before the sample is left at 150° C.

As seen from Tables 2 and 3, when the resin composition of the present invention was irradiated with the electron beam under the presence of a specific crosslinking agent, the resin composition was not melted even in a high temperature range and the storage elastic modulus was able to be obtained. Accordingly, it was confirmed that an effective crosslinking reaction proceeded by the electron beam irradiation under the presence of a specific crosslinking agent.

From Table 3, it was confirmed that the storage elastic modulus also increased as the amount of the crosslinking agent and the electron beam irradiation dose increased. Accordingly, it was confirmed that the degree of crosslinking was dependent on the amount of the crosslinking agent and the electron beam irradiation dose.

In a case of the resin composition only composed of resin and a crosslinking agent, when the amount of the crosslinking agent increased, press molding was not likely to be performed. However, press molding was possible by blending inorganic particles or a white pigment with the resin composition.

From Table 4, it was confirmed that the deformation of the reflecting resin composition irradiated with the electron beam by the reflow test was significantly reduced. In addition, it was confirmed that long-term heat resistance was excellent. Particularly, comparing the results of Example 15 and Comparative Examples 11 and 12 in which the types of the resins were different, it was found that Example 15 exhibited the best dimensional stability and long-term heat resistance.

As described above, the resin composition of the present invention is useful for a reflector, and a reflecting material for semiconductor light emitting devices.

REFERENCE SIGNS LIST

10 . . . Optical semiconductor element
12 . . . Reflector
14 . . . Substrate
16 . . . Lead wire
18 . . . Lens

The invention claimed is:
1. A reflector, comprising:
a cured product of an electron beam curable resin composition comprising:
polymethylpentene;
a crosslinking agent; and
white pigment,
wherein the crosslinking agent is expressed by the following Formula (1)

wherein in the Formula (1), R1 to R3 are each independently any allylic substituent of an allyl group, a methallyl group, an allyl group through ester bonding, and a methallyl group through ester bonding,
a molecular weight is 1,000 or less, and
wherein an average particle size of the white pigment is 0.21 μm to 0.50 μm,
wherein a reflectivity of the reflector is 83% or more as measured at wave length of 450 nm using a spectroscopic photometer after exposure to a temperature of 150° C. for between 24 hours and 500 hours.
2. The reflector according to claim 1, further comprising inorganic particles other than the white pigment.
3. The reflector according to claim 2, wherein the inorganic particles other than the white pigment are spherical fused silica particles and/or modified cross-section glass fibers.

4. The reflector according to claim 3, wherein the inorganic particles other than the white pigment is modified cross-section glass fibers.

5. The reflector according to claim 3, wherein the inorganic particles other than the white pigment is spherical fused silica particles which has a volume average particle size of from 0.1 to 500 μm.

6. The reflector according to claim 1,
wherein 0.1 parts by mass to 15 parts by mass of the crosslinking agent is blended with respect to 100 parts by mass of polymethylpentene.

7. The reflector according to claim 1,
wherein a thickness is 0.1 mm to 3.0 mm.

8. A method for producing a molded body comprising:
an injection molding process of performing injection molding on the electron beam curable resin composition according to claim 1 at an injection temperature of 200° C. to 400° C. and at a mold temperature of 20° C. to 100° C.; and
an electron beam irradiation process of performing electron beam irradiation treatment before and after the injection molding process.

9. The reflector according to claim 1, wherein the crosslinking agent expressed by the above Formula (1) includes triallyl isocyanurate.

10. A method of reflecting light from the optical semiconductor element by the reflector according to claim 1, comprising:
reflecting, by the reflector, light from the optical semiconductor element to a predetermined direction;
wherein at least a portion of a light reflective surface of the reflector is made of the cured product of the electron beam curable resin composition.

11. The reflector according to claim 1, wherein a light reflectivity of the reflector is 95% or more prior to exposure to the temperature of 150° C.

12. A semiconductor light emitting device comprising:
an optical semiconductor element; and
a reflector which is provided in the vicinity of the optical semiconductor element and reflects light from the optical semiconductor element in a predetermined direction,
wherein the optical semiconductor element and the reflector are provided on a substrate, and
at least a part of the light reflecting surface of the reflector is composed of a cured product of the electron beam curable resin composition, the resin composition comprising:
polymethylpentene;
a crosslinking agent; and
white pigment,
wherein the crosslinking agent is expressed by the following Formula (1)

wherein in the Formula (1), $R^1$ to $R^3$ are each independently any allylic substituent of an allyl group, a methallyl group, an allyl group through ester bonding, and a methallyl group through ester bonding, and
a molecular weight is 1,000 or less, and
wherein an average particle size of the white pigment is 0.21 μm to 0.50 μm,
wherein a reflectivity of the reflector is 83% or more as measured at a wavelength of 450 nm using a spectroscopic photometer after exposure to a temperature of 150° C. for between 24 hours and 500 hours.

* * * * *